United States Patent
Itoh et al.

(10) Patent No.: US 8,026,851 B2
(45) Date of Patent: Sep. 27, 2011

(54) PLANAR ANTENNA AND MANUFACTURING METHOD THEREOF

(75) Inventors: Kiyohiko Itoh, Kameyama (JP); Kentaro Mori, Kusatsu (JP)

(73) Assignee: Toray Industries, Inc., Chou-Ku (JP)

( * ) Notice: Subject to any disclaimer, the term of this patent is extended or adjusted under 35 U.S.C. 154(b) by 589 days.

(21) Appl. No.: 11/909,570

(22) PCT Filed: Mar. 22, 2006

(86) PCT No.: PCT/JP2006/305643
§ 371 (c)(1),
(2), (4) Date: Dec. 15, 2008

(87) PCT Pub. No.: WO2006/103981
PCT Pub. Date: Oct. 5, 2006

(65) Prior Publication Data
US 2009/0219212 A1    Sep. 3, 2009

(30) Foreign Application Priority Data
Mar. 25, 2005 (JP) .................................. 2005-087897

(51) Int. Cl.
*H01Q 1/38* (2006.01)
(52) U.S. Cl. .................................... 343/700 MS; 29/600
(58) Field of Classification Search ........... 343/700 MS, 343/873, 895; 340/572.1, 572.7, 572.8; 29/600
See application file for complete search history.

(56) References Cited

U.S. PATENT DOCUMENTS
6,936,336 B2 *  8/2005  Matsunaga et al. ........... 428/209
7,102,520 B2 *  9/2006  Liu et al. .................... 340/572.1

FOREIGN PATENT DOCUMENTS

| JP | 08-213419 | 8/1996 |
| JP | 08-310172 | 11/1996 |
| JP | 9-92943 A | 4/1997 |
| JP | 9-148378 A | 6/1997 |
| JP | 11-328349 A | 11/1999 |
| JP | 2000-67200 A | 3/2000 |
| JP | 2000-113144 | 4/2000 |
| JP | 2000-155822 A | 6/2000 |
| JP | 2002-042098 | 2/2002 |
| JP | 2002-298109 A | 10/2002 |
| JP | 2003-037348 | 2/2003 |
| JP | 2003-037427 | 2/2003 |

(Continued)

OTHER PUBLICATIONS

International Search Report dated Apr. 25, 2006, application No. PCT/JP2006/305643.

*Primary Examiner* — Hoang V Nguyen
(74) *Attorney, Agent, or Firm* — RatnerPrestia

(57) ABSTRACT

A planar antenna has a circuit pattern including an antenna part and a connection terminal part on a plastic film, in which the circuit pattern has a metal layer and a heat-sealable conductive layer provided on a surface layer of a connection terminal part of the metal layer. The planar antenna is obtained by forming a circuit pattern including a metal layer on a plastic film, providing a heat-sealable conductive layer in a connection terminal part of the circuit pattern, and then removing an unnecessary part with etching.

13 Claims, 1 Drawing Sheet

FOREIGN PATENT DOCUMENTS

| | | |
|---|---|---|
| JP | 2003-76969 A | 3/2003 |
| JP | 2003-162701 A | 6/2003 |
| JP | 2003-332714 A | 11/2003 |
| JP | 2004-62634 A | 2/2004 |
| JP | 2004-139405 A | 5/2004 |
| JP | 2004-180217 | 6/2004 |
| JP | 2004-529499 | 9/2004 |

* cited by examiner

[Fig. 1]
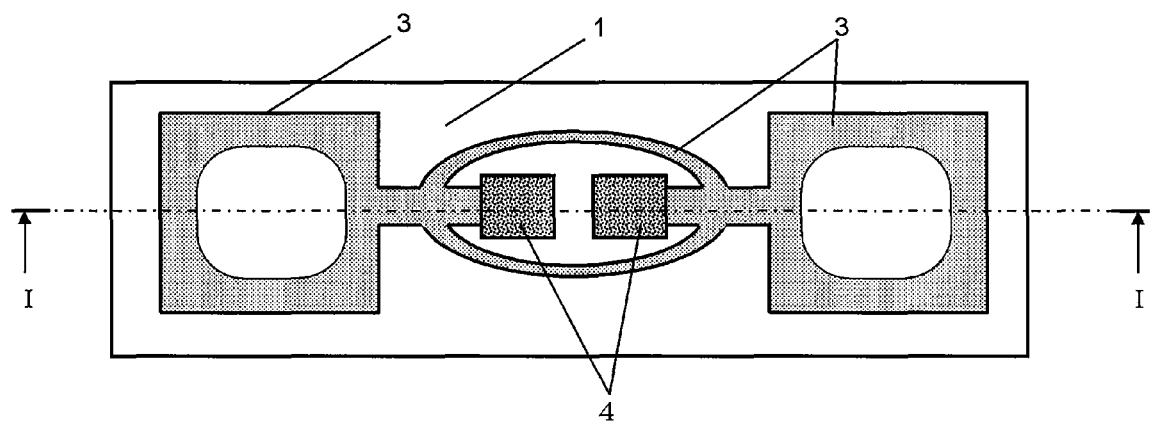
[Fig. 2]
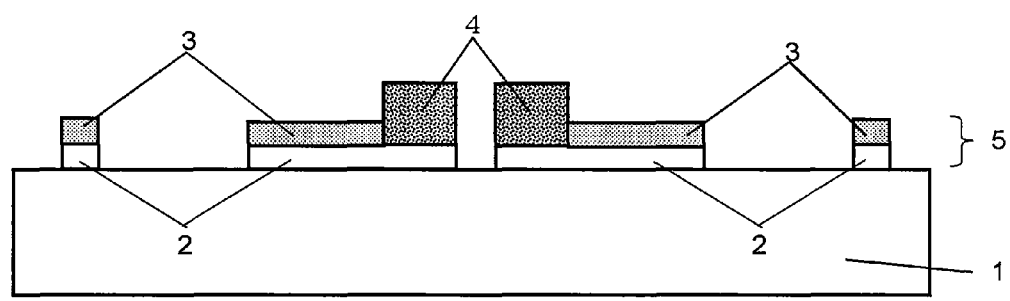

PLANAR ANTENNA AND MANUFACTURING METHOD THEREOF

This is a U.S. National Phase application of application number PCT/JP2006/305643, filed Mar. 22, 2006, the entire disclosure of which is expressly incorporated by reference herein.

TECHNICAL FIELD

The present invention relates to a planar antenna that can be preferably used as an antenna for an IC tag or a non-contact IC card and a manufacturing method thereof.

BACKGROUND ART

In recent years, a non-contact IC card and an IC tag in which transmitting and receiving of an electromagnetic signal output by a reader/writer are performed without contact have been developed and put to practical use. A planar antenna which constitutes an antenna circuit pattern (a circuit pattern) of such non-contact IC card or IC tag includes A) a planar antenna in which the circuit pattern is formed by etching a copper foil, an aluminum foil or the like pasted together with a plastic film (for example, Patent Document 1), B) a planar antenna in which the circuit pattern is formed by printing a conductive coating material in a predetermined form on a plastic film or a plastic sheet (for example, Patent Document 2), C) a planar antenna in which the circuit pattern is metal-plated after it is formed by printing a conductive coating material in a predetermined form on a plastic film or a plastic sheet (for example, Patent Document 3), and D) a planar antenna in which the circuit pattern is formed by drawing-out with a drawing blade an antenna circuit pattern from a plastic film in which copper foils or aluminum foils are layered (for example, Patent Document 4).

However, in the case of the above-described A), there is a necessity of removing an unnecessary part with etching after the circuit pattern is formed on the copper foil, the aluminum foil, or the like pasted together with the plastic film with a photo resistor the like. Especially, it is difficult to lower costs because the whole or a part of the resist layer where the circuit pattern is formed has to be removed in order to electrically connect the terminal parts of an electronic component and an antenna. Further, for planar antennas in which the circuit pattern is formed by printing the conductive coating material as in the above-described B) and C), the electric resistance is easy to become high. Although the coating thickness can be increased in order to decrease the resistance, if so, the circuit pattern cracks when it is bent and the communication property of the antenna is easy to be unstable. Furthermore, for a planar antenna in which the circuit pattern is formed by metal-plating after printing with a conductive coating material as in the above-described C), adhesiveness of the metal-plated layer deteriorates at a part with a fine line width, the circuit pattern is easy to slip off in a transporting step, and high costs at a metal-plating step cannot be avoided. Then, in the case of the above-described D), there is a problem that it is difficult to improve the line width accuracy of the circuit pattern.

On the other hand, regarding an electric connection of the circuit pattern and an electronic component such as an IC chip, a non-contact IC card and an IC tag are proposed in which an anisotropic conductive adhesive layer or a metal wire is provided at a connection terminal part of the circuit pattern and an electronic component such as an IC chip is directly placed thereon (for example, Patent Documents 5 to 8).

However, because inexpensive aluminum is often used as a conductor constituting the circuit pattern, and in that case, an oxide layer is easily formed on the surface of aluminum, there is a problem that adhesiveness of anisotropic conductive adhesive and aluminum decreases and the electric resistance value is easy to increase even though the electronic component is connected to the connection terminal part of the circuit through the anisotropic conductive adhesive. Especially, the planar antenna may be subjected to a severe acceleration test in which it is kept under a high temperature and high humidity of 40° C. and 90% RH for 2 weeks with the assumption of the environment where an IC tag is used in order to confirm whether there is deterioration of the performance as a planar antenna or not. However, by performing this test, the oxide layer on the surface of aluminum increases further, the connection resistance becomes large, and sometimes there is a problem that communication with a reader/writer easily becomes unstable.

Patent Document 1: Japanese Patent Application Laid-Open (JP-A) No. 2003-37348 (Claims)
Patent Document 2: JP-A No. 2004-180217 (Claims)
Patent Document 3: JP-A No. 2004-529499 (Claims)
Patent Document 4: JP-A No. 2003-37427 (Claims)
Patent Document 5: JP-A No. 08-310172 (Claims)
Patent Document 6: Japanese Patent No. 2818392 (Claims)
Patent Document 7: JP-A No. 2000-113144 (Claims)
Patent Document 8: JP-A No. 2002-42098 (Claims)

DISCLOSURE OF THE INVENTION

Problems to be Solved by the Invention

An objective of the present invention is to provide an inexpensive planar antenna having a low resistance circuit and that is superior in electric connection reliability with an electronic component such as an IC chip and a manufacturing method thereof.

Means for Solving the Problems

The present invention consists of a constitution of (1) to (14) below in order to solve the above-described problems.

(1) A planar antenna having a circuit pattern comprising an antenna part and a connection terminal part on a plastic film, in which the circuit pattern has a metal layer and a heat-sealable conductive layer provided on a surface layer of a connection terminal part of the metal layer.

(2) The planar antenna as in the above-described (1), having a protective layer of the antenna part on a surface layer of an antenna part of the metal layer.

(3) The planar antenna as in the above-described (1) or (2), in which the surface resistance value of the metal layer is 0.5 to 200 mΩ/□.

(4) The planar antenna as in anyone of the above-described (1) to (3), in which the metal layer is substantially composed of aluminum.

(5) The planar antenna as in anyone of the above-described (1) to (4), in which the metal layer is a metallic vacuum deposition layer.

(6) The planar antenna as in anyone of the above-described (1) to (5), in which the conductive layer is a resin layer containing a conductive particle or a conductive fiber.

(7) The planar antenna as in the above-described (6), in which the resin layer is comprised of an epoxy resin, a curing agent of the epoxy resin, and a rubber.

(8) The planar antenna as in the above-described (7), in which the rubber is a rubber having an unsaturated carbon bond in the main chain.

(9) The planar antenna as in anyone of the above-described (1) to (8), in which the thickness of the conductive layer is 1 to 50 μm.

(10) A manufacturing method of a planar antenna including a step A of providing a metal layer constituting a circuit pattern comprising an antenna part and a connection terminal part on a plastic film, a step B of providing a protective layer of antenna part on a part constituting an antenna part of the metal layer, a step C of providing a heat-sealable conductive layer on a part constituting a connection terminal part of the metal layer, and a step D of removing a part that does not constitute a circuit pattern of the metal layer with etching after the step B and the step C.

(11) The manufacturing method of a planar antenna as in the above-described (10), in which a metal layer with a thickness of 0.2 to 50 μm is provided in the step A.

(12) The manufacturing method of a planar antenna as in the above-described (10) or (11), in which a circuit pattern is formed by using a film provided with a metal layer on a plastic film with vacuum deposition in the step A.

(13) The manufacturing method of a planar antenna as in any one of the above-described (10) to (12), in which a metal layer substantially comprised of aluminum is provided in the step A.

(14) The manufacturing method of a planar antenna as in the above-described (13), in which an alkaline resistant protective layer is provided in the step B, an alkaline resistant conductive layer is provided in the step C, and etching is performed using an alkaline liquid in the step D.

Here, the planar antenna of the present invention is a film- or a sheet-shaped antenna, and it is distinguished from a winding coil antenna. However, the planar antenna of the present invention may be used bent in the case of using it as an inlay (inlet) or an IC tag.

The circuit pattern is comprised of an antenna part and a connection terminal part. The connection terminal part is a conductive part to connect electrically the planar antenna and a connection terminal of an electronic component such as an IC chip or an IC strap. Meanwhile, the antenna part is a part in the planar antenna provided on a plastic film other than the connection terminal part of the circuit pattern, and is a part affecting the transmitting and receiving of electromagnetic induction due to an electric wave or a magnetic field from a transmitting and receiving device such as a reader/writer.

Effects of the Invention

Because the planar antenna of the present invention has a heat-sealable conductive layer on the surface layer of the connection terminal part of the metal layer constituting the circuit pattern, the conductive layer and an electrode part of the electronic component such as an IC chip or an IC strap can be connected directly by heat-sealing them with thermocompression or ultrasonic welding without using conventional wire bonding, an anisotropic conductive sheet (ACF), or the like.

Then, in the case of having a protective layer in the surface layer of the antenna part of the metal layer constituting the circuit pattern, deterioration due to oxidation of the metal layer, or the like can be decreased, and a decrease of the communication property in long term use can be suppressed, even though the protective film is not laminated and processed to an IC tag, an IC card, or the like, that is, the planar antenna is used in a form of an exposed inlay (inlet). Further, because oxidation deterioration of the metal layer is small, adhesion with a plastic sheet and an adhesive film is good and peeling hardly occurs between the circuit pattern and a plastic sheet or an adhesive film even with an outer force such as bending of the planar antenna or when a plastic sheet (for example, a plastic sheet containing a polyester resin (PET-G) in which 1,4-cyclohexanedimethanol is copolymerized with polyethylene terephthalate) is layered and heated or an adhesive film is laminated. Because of that, the change of the dielectric constant between the circuit pattern and a plastic sheet or an adhesive sheet is small, and the communication property becomes stable. Further, the planar antenna can be colored in various colors by adding pigments or dyes in the protective layer, and in this case, it can be visually distinguished and used as an inlay (inlet) or an IC tag or an IC card in which a plastic film with transparency is layered.

When the surface resistance value of the metal layer constituting the circuit pattern is 0.5 to 200 mΩ/□ or less, a good communication property can be obtained while minimizing the thickness of the metal layer and the costs in the case that an IC chip or the like is mounted and the planar antenna is made into an inlay (inlet), an IC tag, or an IC card. In the case of constituting the metal layer substantially from aluminum, an inlay (inlet), an IC tag, or an IC card can be made light weight, and the influence on the environment is small in the case of disposal because aluminum has been changed into aluminum oxide or aluminum hydroxide during long term use. In the case that the metal layer is a metallic vacuum deposition layer, the planar antenna can be made thin, it is flexible compared with a metal foil, and it can be easily processed into a label or the like. Further, the decrease of the communication property when repeatedly bent is very small compared with a planar antenna in which the circuit pattern is formed with a conductive coating material.

Further, in the case where the conductive layer of the connection terminal part is a resin layer containing conductive particles, it becomes possible to perform welding with an electrode part of the electronic components such as an IC at a low temperature of 60 to 70° C. compared with the case where the connection terminal part is formed with soldering. At this time, formation of the connection terminal part with a screen-printing method becomes easy especially when fine conductive particles of 5 μm or less are used. Furthermore, because the increase of the resistance value at an electric connection part of an electrode part of the electronic components such as an IC chip and an IC strap (an interposer) and an antenna circuit part cannot be observed even when performing an acceleration test under high temperature and high humidity, a communication property can be maintained stable for a long period of time. Here, the IC strap is a substrate on which an enlarged electrode is formed with a conductive coating material or the like so as to connect to an electrode (bump) part of the IC chip.

Then, when a rubber is contained in a resin containing conductive particles, peeling of the electrode part of the electronic components such as an IC chip and an IC strap from the connection terminal part of the circuit pattern hardly occurs even when a long term vibration is applied to the IC tag or the like after an IC chip or an IC strap is mounted and the planar antenna is made into an inlay (inlet), an IC tag or an IC card, and a communication property can be maintained stable for a long period of time.

When a rubber having an unsaturated carbon bond in the main chain is used as the rubber, adhesiveness and breaking bend durability become good. Further, a rubber having an unsaturated carbon bond in the main chain can be preferably used in the manufacturing method of the present invention because it dissolves or softens into an organic solvent, water, or a mixed solvent thereof. Among the rubbers, when an acrylonitrile butadiene-based rubber is used, a communication property can be maintained stable for a long period of time because a crack is hardly generated in the connection terminal part even when a long term vibration is applied after mounting on the electronic components such as an IC chip and an IC strap. In particular, when 50% by weight or more of a carboxylated acrylonitrile-butadiene rubber is contained, it becomes possible to connect sufficiently with the electrode part of the electronic components such as an IC chip and an IC strap, even when the temperature of its connection part is 150° C. or less.

In the present invention, electrical connectivity with the electrode part of an IC chip or an IC strap also becomes good in the case where the thickness of the conductive layer of the surface layer of the connection terminal part is 1 to 50 µm; especially, the resistance value and impedance in a high frequency range of the electrode part of the electronic components such as an IC chip and an IC strap and of the connection terminal part of the circuit pattern hardly increase even when they are kept at a high temperature and a high humidity for a long time, and a communication property can be maintained stable for a long period of time.

Meanwhile, according to the manufacturing method of the planar antenna of the present invention, because the step of removing the resist layer in which the circuit pattern is formed or the step of forming the connection terminal part to perform electrical connection with the electronic components such as an IC chip and an IC strap by removing a part of the resist layer becomes unnecessary, it becomes possible to drastically reduce a manufacturing cost.

Upon providing the metal layer constituting the circuit pattern including the antenna part and the connection terminal part on a plastic film, by using a vacuum deposition film in which a metal such as aluminum is deposited on a plastic film and forming a circuit pattern therefrom, it becomes possible to make the etching time a half or less compared to the case of pasting a metal foil of the same thickness as the vacuum deposition film together with a plastic film, and it becomes possible to reduce the manufacturing cost in the etching step.

Further, by providing a metal layer in which the thickness is in the range of 0.2 to 50 µm, etching becomes easy, and the circuit pattern is hardly peeled at etching. Furthermore, when the metal layer substantially consists of aluminum, an etching solution that is relatively less expensive such as a potassium hydroxide solution or a sodium hydroxide solution can be used, and the manufacturing cost can be reduced further.

When the protective layer and the conductive layer covering the metal layer are alkaline resistant, the exposed part of the plastic film can be mat-processed (unevenness-processed) with an alkaline liquid after an IC chip or an IC strap is mounted and made into an inlay (inlet), and then adhesion of the exposed part of the plastic film and the other plastic film used at the production of the inlay can be improved. Particularly, in the case of etching using an alkaline liquid as the etching liquid, the concentration and the temperature of the alkaline liquid used in the above-described etching step can be increased when the protective layer and the conductive layer covering the metal layer of the circuit pattern are alkaline resistant; and then removal of a part of the metal layer not constituting the circuit pattern is further accelerated, and the production cost can be reduced.

BEST MODE FOR CARRYING OUT THE INVENTION

The planar antenna of the present invention, for example, as shown in FIGS. 1 and 2, has a circuit pattern 5 consisting of an antenna part and a connection terminal part on a plastic film 1, and the circuit pattern 5 has a metal layer 2 and a heat-sealable conductive layer 4 provided in a surface layer of the connection terminal part of the metal layer 2. The terminal part of the electronic component such as an IC chip or an IC strap can be directly and electrically connected to the heat-sealable conductive layer 4 with a heat treatment, a thermo-compression treatment, an ultrasonic treatment, or the like.

In the case of connecting the terminal part of the electronic component such as an IC chip or an IC strap with heating, the surface layer of the conductive layer 4 is preferably heated at in the range of 30 to 200° C., and more preferably in the range of 60 to 150° C. Further, in the case of connecting with thermocompression, the connection is preferably performed by heating the surface layer at 30 to 200° C. and more preferably 60 to 150° C., and compressing the terminal part at a pressure of 0.1 to 3 GPa and preferably 0.5 to 1 GPa.

In order to improve adhesion between the metal layer 2 and the heat-sealable conductive layer 4, a silane coupling agent, a titanate-based primer, or the like may be provided between the metal layer 2 and the heat-sealable conductive layer 4 constituting the circuit pattern 5. Further, a non heat-sealable conductive layer may lie between the heat-sealable conductive layer 4 and the metal layer 2. However, in this case, in order to keep the electrical connection good with the electrode part of the electronic component such as an IC chip or an IC strap, it is desirable that the thickness of the heat-sealable conductive layer 4 is 10% or more and preferably 30% or more of the total thickness of the heat-sealable conductive layer 4 and the non heat-sealable conductive layer.

Further, the heat-sealable conductive layer 4 preferably does not have a melting point substantially. Here, not having a melting point substantially refers to the conductive layer which does not melt and become a fluid state when heated upto 300° C.

In the present invention, the surface resistance value of the conductive layer 4 is preferably 0.5 to 200 mΩ/□. By making the surface resistance value of the conductive layer 200 mΩ/□ or less, the electrical connection with the terminal part of the electronic component such as an IC chip or an IC strap becomes good, and the impedance at the connection terminal part in a high frequency range of 800 MHz or more can be made small. As the result, a good communication property (sensitivity) as an IC tag or the like can be obtained. On the other hand, in the case where the surface resistance value is less than 0.5 mΩ/□, it is necessary to use a more expensive precious metal such as Au or Pt as the conductive particles, or it is necessary to make the thickness of the conductive layer itself thick, and the price of the planar antenna becomes expensive though the communication property (sensitivity) is good. Therefore, the upper limit is preferably 200 mΩ/□, more preferably 100 mΩ/□, most preferably 50 mΩ/□, and the lower limit is preferably 0.5 mΩ/□.

The conductive layer 4 is preferably a layer consisting of a resin composition in which conductive particles are contained in the resin. By containing the conductive particles, it becomes possible to perform welding with an electrode part of the electronic component such as an IC at a low temperature of 60 to 70° C. compared with the case where the connection terminal part is formed with soldering.

Here, a thermosetting resin containing a polyester resin, a phenoxy resin, an epoxy resin, a polyester resin, or the like as a main component and a photo-curable resin such as a UV curable resin, containing an unsaturated polyester resin, a polyester acrylate resin, a urethane acrylate resin, a silicone acrylate resin, an epoxy acrylate resin, or the like as a main component, can be used as the resin constituting the conductive layer. Two or more of the above-described thermosetting resin and the photo-curable resin such as a UV curable resin can be mixed and used, and a flame retardant, a photosensitizer, a photoinitiator, and the like may be mixed when it is necessary.

Using an epoxy resin among the above-described resins and mixing a curing agent of the epoxy resin and a rubber are preferable because both adhesion with the electrode part of the electronic component such as a IC chip or an IC strap and breaking bend durability can be made good.

The epoxy resin refers to a substance having two or more epoxy groups in one molecule and that is capable of forming a three-dimensional structure, and a bisphenol A type epoxy resin shown in the below formula (1), a bisphenol F type epoxy resin having a formation in which two hydrogen atoms are bonded to a carbon atom at the center of a bisphenol skeleton, a bisphenol AD type epoxy resin in which a methyl group and a hydrogen atom are bonded to a carbon atom at the center of a bisphenol skeleton, or a phenol novolak type epoxy resin obtained by a reaction of phenol novolak that is a reaction product of phenol and formaldehyde and epichlorohydrin is preferably used.

[Formula 1]

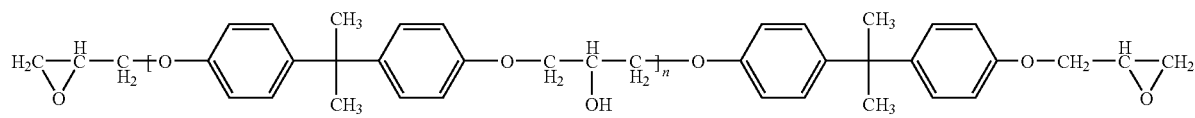

(1)

Further, an epoxy resin such as an alicyclic epoxy resin, a glycidyl ester-based resin, a glycidyl amine-based resin, or a heterocyclic epoxy resin may be used.

An amine-based curing agent represented by $R-NH_2$ (here, R represents an aliphatic hydrocarbon group, an alicyclic hydrocarbon group, or an aromatic hydrocarbon group) is preferably used as the curing agent of the epoxy resin. Further, a polyamide-based curing agent represented by a polyamideamine having one or more amide group(s) in a molecule and an acid anhydride-based curing agent such as an aliphatic acid anhydride, an alicyclic acid anhydride, an aromatic acid anhydride, or a halogen-based acid anhydride may be used.

The rubber includes a rubber having a polymethylene type saturated main chain, a rubber having carbon and oxygen in the main chain, a rubber having an unsaturated carbon bond in the main chain, a rubber having silicon and oxygen in the main chain, a rubber having carbon, oxygen, and nitrogen in the main chain, a rubber having sulfur, oxygen, and carbon in the main chain, and a rubber having phosphor and nitrogen in the main chain. Among these, the rubber having an unsaturated carbon bond in the main chain is preferable because adhesion and breaking bend durability become good, and it dissolves or softens into an organic solvent, water, or a mixed solvent thereof. Furthermore, in particular, an acrylonitrile butadiene-based rubber is preferable because the acrylonitrile butadiene-based rubber is superior in compatibility with the epoxy resin, separation hardly occurs after mixing, and heat-sealability of the conductive layer becomes good. Then a crack is hardly generated at the connection terminal part even when vibration is applied for a long period of time after mounting into the electronic components such as an IC chip and an IC strap; and so adhesion at a mounting connection part can be maintained stable for a long period of time even under an environment where high temperature, high humidity, and vibration are applied.

Specific examples of such acrylonitrile butadiene-based rubber are a nitrile rubber (an acrylonitrile-butadiene rubber), a carboxylated nitrile rubber (a carboxylated acrylonitrile-butadiene rubber), a nitrile-based rubber such as a hydrogen added nitrile rubber, and an acrylonitrile-butadiene-isoprene rubber.

Then, among these, containing 50% by weight or more of the carboxylated nitrile rubber (a carboxylated acrylonitrile-butadiene rubber) is especially preferable because it becomes possible to improve heat-sealability, and it becomes possible to bond sufficiently even when the temperature of the connection part with the electrode part of the electronic components such as an IC chip and an IC strap is made to 150° C. or less in the case of making an IC tag or the like by mounting an IC chip or an IC strap.

Meanwhile, a known substance such as metal particles of metals, metal alloys, or metal oxides of aluminum, gold, platinum, silver, palladium, copper, iron, nickel, tin, zinc, solder, stainless steel, ITO, and ferrite, conductive carbon (including graphite) particles, and resin particles in which the above-described metals are plated can be used as the conductive particles.

The type of the metal is preferably gold, platinum, and silver that are superior in electric conductivity, and silver that is less expensive is especially preferable. Among these, silver particles having an average particle diameter of 0.1 to 10 μm by a call counter method, especially flaky-shaped or flat-shaped silver particles, are preferable because both adhesiveness with the electronic component and conductivity become good, and a decrease of conductivity due to oxidation deterioration hardly occurs even when it is kept for a long period of time under high temperature and high humidity. Further, in order to increase conductivity, carbon nano tubes and conductive carbon particles can be used together with the particles of the above-described metal materials.

Moreover, conductive fibers such as metal fibers, carbon fibers, and metal plated fibers can be used instead of the conductive particles.

For dispersion of the conductive particles or the like into a resin used for the conductive layer, as normally performed, a dispersing machine such as a media dispersing machine using glass beads or a ball mill may be used, or a dispersing machine such as a plast mill or an ultrasonic dispersing machine may also be used. In the dispersion of the conductive particles, for example, the dispersion process may be performed with any of the above-described dispersing machines for a half day to one day after adding the conductive particles into an organic solvent dissolved liquid of the above-described resin at a fixed amount at several times. The organic solvent used in the dispersion may be any solvent as long as it can dissolve the resin to be used. However, an aromatic organic solvent such as toluene or xylene, γ-butyrolactone, or the like is used in general.

Moreover, other components may be contained in the resin forming the conductive layer in the range that the objective of the present invention is not spoiled.

The thickness of the above-described conductive layer 4 is preferably in the range of 1 to 50 μm, more preferably 1 to 30 μm, and above all, preferably in the range of 5 to 15 μm. In order to adjust the thickness, the amount of the various additives as described above is adjusted, and the printing condition is adjusted such as the mesh of the screen plate at printing, the thickness of the emulsion at the mask part, the type, the thickness, and the shape of the squeegee, the angle between the squeegee and the screen plate, the moving speed of the squeegee, or the height of the screen plate and the printing object. It is preferable the thickness of the conductive layer is 1 μm or more because the electric resistance value at the connection terminal part in the planar antenna becomes small, and adhesion with the connection terminal part of the electronic components such as an IC chip becomes high. Further, it is preferable the thickness is 50 μm or less because it is not too thick, the surface becomes flat, not only it becomes easy to laminate the plastic film thereon and to form the adhesive layer, but also the communication property of an IC tag or the like becomes stable without suffering cracks at the connection terminal part when bending is repeated and without changing the electric conductivity.

Then, in the present invention, it is preferable that the protective layer 3 is provided on the surface layer of the antenna part constituting the circuit pattern 5 to prevent deterioration of the metal layer due to oxidation and to make adhesion of other films or sheets to the antenna part good. In order to improve adhesion between the metal layer 2 and the protective layer 3, a silane coupling agent, a titanate-based primer, or the like may be provided between the metal layer 2 and the protective layer 3. Further, the conductive layer may be laid between the protective layer 3 at the surface layer of the antenna part and the metal layer 2 to lower the electric resistance of the metal layer.

Any of thermosetting resins and photo-curable resins such as a UV light curable resin may be used as the protective layer 3 provided at the surface layer of the antenna part. A resin such as a polyester resin, a phenoxy resin, an epoxy resin, or a polyester resin in which a solvent or a binder is mixed and stirred can be used as the thermosetting resin. One or more type(s) of the resin(s) selected from an unsaturated polyester resin, a polyester acrylate resin, a urethane acrylate resin, a silicone acrylate resin, an epoxy acrylate resin, and the like and a mixture with a photoinitiator thereof when it is necessary may be used as the photo-curable resin. Understandably enough, a curing agent, a curing accelerator, a binder, a viscosity adjustor such as a filler to improve printability, or the like may be mixed in these resins depending on necessity. Moreover, natural drying, heat drying by hot air or an infrared heater, or active ray irradiation such as an ultraviolet ray irradiation is normally used as a method of curing after the circuit pattern is printed in order to form the conductive layer and the protective layer.

The thickness of the protective layer 3 provided on the surface layer of the antenna part is preferably in the range of 0.3 to 6 μm, and more preferably in the range of 0.5 to 4 μm. It is preferable its thickness is 0.3 μm or more because the formation of the circuit pattern by printing becomes easy. It is preferable the thickness is 6 μm or less because it is not too thick, the surface becomes flat, and it becomes easy to laminate the plastic film and to form the adhesive layer thereon. In order to adjust the thickness, the amount of the various additives as described above is adjusted, and in the case of forming the protective layer with a screen-printing method, the mesh of the screen plate at printing, the thickness of the emulsion at a mask part, the type, the thickness, and the shape of the squeegee, the angle between the squeegee and the screen plate, the moving speed of the squeegee, or the height of the screen plate and the printing object may be changed. In the case of forming the protective layer with a gravure printing method, the groove depth of the gravure plate and the pressing pressure of the back roll may be appropriately adjusted.

The resin constituting the protective layer 3 may be a copolymer, may be a mixture of resins of different types, or may be a resin including an inorganic filler such as silica or a metal oxide. Furthermore, it may contain conductive particles such as nickel, gold, silver, and copper, or resin particles in which these metals are plated. However, the content of the conductive particles in the protective layer 3 provided on the antenna part is desirably 30% by volume or less, and preferably 10% by volume or less. When the content of the conductive particles exceeds the above-described range, adhesiveness of the protective layer and the metal layer easily decreases, and the protective layer easily suffers cracks especially when a long term vibration or bending movement is applied.

The plastic film 1 of the present invention is a film obtained by processing a material that can be processed with melt extrusion molding such as polyester, polyolefin, polyamide, polyesteramide, polyether, polystyrene, polypneylenesulfide, polyetherester, polyvinyl chloride, or poly(meth)acrylic acid ester, and may be any of an unoriented film, an uniaxially oriented film, and a biaxially oriented film.

Among these, a polyester film, a polyolefin film, and a polyphenylenesulfide film are preferable from the viewpoint of the price and mechanical characteristics, and especially, a biaxially oriented polyester film is preferable because it is well balanced in the price, heat resistance, and mechanical characteristics.

Polyester to be a material of the polyester film includes polyethylene terephthalate, polyethylene-2,6-naphthalate, polybutylene terephthalate, and polyethylene-α,β-bis(2-chlorophenoxy)ethane-4,4'-dicarboxylate. Further, other dicarboxylic acid components and diol components may be copolymerized to these polyesters in a range of 20 mol % or less in the range that the effect of the present invention is not hindered.

The plastic film used in the present invention may be a film in which various surface treatments (for example, a corona discharging treatment, a low temperature plasma treatment, a glow discharge treatment, a flame treatment, an etching treatment, a roughening treatment, or the like) are performed.

The thickness of the plastic film 1 used in the present invention is preferably 1 to 250 μm, more preferably 10 to 125 μm, and further preferably 20 to 75 μm from the viewpoint of flexibility and mechanical strength. Further, in the present invention, two or more films are laminated and can be used as the plastic film 1. The thickness can be measured in accordance with JIS-K-7130: 1999.

In the present invention, the metal layer 2 may be a layer consisting of a metal, and preferably a layer consisting of a metal that is superior in electrical conductivity such as aluminum, gold, platinum, silver, palladium, copper, iron, nickel, tin, or zinc. The metal layer 2 can be obtained by layering a metal foil obtained by a usual known method such as a rolling method or with a method of forming with a sputtering method, or can be obtained by a vacuum deposition method, an electron beam deposition method, an ion plating deposition method, a wet plating, or the like.

In the case where the metal layer 2 is substantially constituted with aluminum, the handling property in the production step and the handling property of a final product such as an IC tag become good because the circuit part can be formed with high speed and good accuracy in the etching in which an alkaline liquid is used, and the weight of the intermediate product in which the metal layer is provided in the plastic film becomes light compared with the case of using a metal such as copper. Moreover, substantially constituted with aluminum refers to a state in which 70% by weight or more of an aluminum metal is contained by an element analysis with a fluorescence x-ray method or the like, and the condition in which 90% by weight or more of an aluminum metal is contained is more preferable.

In the present invention, the surface resistance value of the metal layer 2 is preferably 0.5 to 200 m$\Omega$/□, and more preferably 0.5 to 100 m$\Omega$/□. By making the surface resistance value of the metal layer 2 200 m$\Omega$/□ or less, a better communication property (sensitivity) can be obtained when used as an antenna of an IC tag or the like. On the other hand, in the case where the surface resistance value is less than 0.5 m$\Omega$/□, although the communication property (sensitivity) is good, it is necessary to use a more expensive precious metal, or it is necessary to make the thickness of the metal layer itself thick, and the price of the planar antenna becomes expensive. Therefore, the upper limit is preferably 200 m$\Omega$/□, more preferably 100 m$\Omega$/□, most preferably 50 m$\Omega$/□, and the lower limit is preferably 0.5 m$\Omega$/□.

In the present invention, the metal layer 2 is preferably a metallic vacuum deposition layer. The metallic vacuum deposition layer is obtained by performing vacuum deposition with at least one type of metal such as gold, silver, copper, aluminum, zinc, nickel, and tin using a known vacuum deposition machine (a crucible type or a boat type) under high vacuum of $10^{-4}$ Torr or less with a resistance heating method, an induction heating method, or an EB heating method, for example. In the case where a predetermined resistance value or a deposition thickness cannot be achieved with one run of the vacuum deposition, the vacuum deposition may be repeated until the predetermined resistance value and the deposition thickness can be achieved. Further, alloying (for example, after aluminum is deposited thin, zinc is formed in the same vacuum deposition machine so as to be a predetermined thickness) may be performed by performing vacuum deposition of different metals (for example, aluminum and zinc) separately in the vacuum deposition machine.

The metallic vacuum deposition layer is desirably a vacuum deposition layer substantially consisting of aluminum from the viewpoints of an electrical resistance value, cost, ease of etching, and weight waving of the planar antenna.

In addition, the thickness of the metallic vacuum deposition layer is desirably 0.2 to 10 µm. It is preferable the thickness is 0.2 µm or more because the volume specific resistance value and impedance in the high frequency range become small, and the characteristics as a circuit becomes good. On the other hand, when the thickness is 10 µm or less, not only it is not too thick and a circuit shape can be easily formed with etching, but also flexibility of the planar antenna becomes good, and adhesion between the vacuum deposition layer and the plastic film hardly decreases even bending is repeated, and the vacuum deposition layer hardly suffers peeling and cracks. For this reason, it is preferable because the communication property as an antenna hardly decreases. However, in order to realize a surface resistance value of 100 m$\Omega$/□ or less in the aluminum vacuum deposition layer, the thickness of the vacuum deposition layer is preferably 0.5 µm or more. Further, in order to realize a surface resistance value of 50 m$\Omega$/□ or less, the thickness of the layer is preferably 1 µm or more.

In the case of connecting the connection terminal part to an electronic component such as an IC chip or an IC strap, the planar antenna of the present invention as described above basically has a configuration in which the metal layer, the conductive layer, and the electrode part of the electronic component such as an IC chip or an IC strap are layered in this order. That is, there is no necessity of laying a wire bonding, an anisotropic conductive sheet (ACF), or the like therebetween when connecting the planar antenna of the present invention with the electronic component. Nevertheless, the electrical connection between the conductive layer provided in the surface layer of connection terminal part of the circuit pattern and the terminal part of the electronic components becomes good, and it becomes possible to maintain high connection reliability with little deterioration even an acceleration test under high temperature and high humidity is performed.

The electrode part of the electronic component such as an IC chip or an IC strap connected to the connection terminal part of the planar antenna of the present invention may be any of a metal terminal (bump) comprised of gold, aluminum, copper, silver, or the like having an area of 0.01 mm$^2$ or more, a metal terminal (bump) in which a gold plating of about 15 µm is performed on copper or the like, and a terminal on which a conductive coating material is applied. However, an electrode terminal of a thickness of 5 µm or more formed by applying and curing the conductive coating material is preferable because it can connect electrically in a short time with the planar antenna of the present invention.

The planar antenna of the present invention as described above can be obtained by going through a step A of providing a metal layer constituting a circuit pattern including an antenna part and a connection terminal part, a step B of providing a protective layer of the antenna part on a part constituting an antenna part of the metal layer, a step C of providing a heat-sealable conductive layer on a part constituting a connection terminal part of the metal layer, and a step D of removing a part that does not constitute a circuit pattern of the metal layer after the step B and the step C. Specifically, for example, after providing the metal layer 2 on the plastic film 1 by the above-described method (step A), the circuit pattern 5 or the antenna part of the circuit pattern 5 is formed by printing with an ink composition containing a non-conductive resin or the like with a screen-printing method or a gravure printing method. At this time, the protective layer 3 is provided on the surface layer of the circuit pattern (step B). After that, a heat-sealable conductive resin composition is formed by printing so as to contact or overlap a little to the end part of the circuit pattern with a screen-printing method or a gravure printing method. That is, the heat-sealable conductive layer 4 is provided at the connection terminal part of the circuit pattern 5 (step C). Then, the protective layer 3 and the conductive layer 4 of the circuit pattern 5 are cured by active rays such as UV or drying and heating. After that, a part that does not constitute the above-described circuit pattern 5 of the metal layer 2 is removed with an etching method (step D). Here, the order of the step B and the step C may be reversed. However, it is necessary to form the conductive layer on the metal layer.

When the metal layer is provided in the above-described step A, it is preferable that the thickness thereof is 0.2 to 50

μm, and preferably 0.2 to 10 μm. When the thickness of the metal layer is in the above-described range, etching becomes easy, and the communication property (sensitivity) when used as the antenna of an IC tag or the like can be satisfied.

The case of providing the metal layer substantially consisting of aluminum in the step A is preferable because the unnecessary metal part can be removed with high speed and good accuracy in the case of performing etching in the step D, especially the case of providing an alkaline resistant layer as the protective layer and the conductive layer and performing alkaline etching using a sodium hydroxide solution, a potassium hydroxide solution, or the like in addition to the above-described effects.

Furthermore, in the case of providing the metal layer with vacuum deposition in the step A, the alkaline etching speed can be made higher by two times or more compared with the metal layer consisting of a metal foil of the same thickness, and productivity can be drastically improved. In the step C, the thickness of the conductive layer is preferably in the range of 1 to 50 μm. When the thickness of the conductive layer is in this range, a planar antenna can be made flat even when it is wound up into a roll shape, and the electrical connection to the electrode part of an IC chip, an IC strap or the like can be made good.

In the step B, the circuit pattern and the protective layer are formed by printing using a screen in which a predetermined circuit pattern is formed, for example. After the screen-printing, it is dried, for example, at 50 to 100° C. for 4 to 5 minutes. After that, in the step C, the conductive resin is printed with the above-described screen so as to overlap the end part of the protective layer previously formed, and then it is dried at 50 to 100° C. for 5 minutes or more.

In the step C, the printing thickness is preferably adjusted so that the surface resistance value of the obtained conductive layer is 200 mΩ/□ or less by dispersing the conductive particles or the like into the above-described resin when the heat-sealable conductive layer is provided on the surface layer of a part constituting the connection terminal part of the metal layer. However, as described above, the thickness is preferably 50 μm or less.

Here, the time of the dispersion may be determined by measuring the volume resistivity of the obtained conductive layer repeatedly so that the changing rate of volume resistivity becomes within 20%. To measure the volume resistivity of the conductive layer to evaluate the degree of dispersion, for example, a sample is formed by applying a mixed liquid of the resin and conductive particles on a substrate such as a plastic film with a film thickness of 100 μm, a width of 1 cm, and a length of 7 cm using a coating tool such as an applicator followed by drying and curing the resin at a predetermined temperature and time (normally, at 110° C. for 3 minutes), and a conductive coated film side of the sample is measured with a resistivity measurement instrument (for example, Loresta GP, Type MCP-T600, and TFP probe: Model MCP-TFP manufactured by DIA INSTRUMENTS CO., LTD.) at a temperature of 25° C. and under a humidity of 50% RH. Of course, the dispersion state may be confirmed using a method such as a transmission electron microscope or a laser microscope.

When the volume resistivity of the conductive layer after drying and curing the mixed liquid of the resin and the conductive particles is $1 \times 10^{-3}$ Ω·cm or less, preferably $1 \times 10^{-4}$ Ω·cm or less, and more preferably $1 \times 10^{-5}$ Ω·cm or less, the surface resistance value can be decreased and the amount of the resin added can be increased without making the conductive layer thick. Therefore, the electrical conductivity can be maintained good even bending and vibration are applied to the connection terminal part.

In the step D, for example, in the case of using copper to form the metal layer, the planar antenna being manufactured is soaked in about 3% by weight of an iron (II) chloride solution heated to 40 to 45° C. for a few minutes, and then washed. Further, in the case of using aluminum to form the metal layer, it is soaked in about 2% by weight of a sodium hydroxide solution or a potassium hydroxide solution heated to 40 to 45° C. for a few minutes, and then neutralized with hydrochloric acid, acetic acid, or the like and washed with water. By performing such procedures, a part that does not become the circuit pattern in the metal layer can be removed (etched).

EXAMPLES

In the following, the present invention is explained by referring to Examples. Evaluation methods of samples formed in each Example and Comparative Example are shown below.

[Evaluation Methods]

1. Surface Resistance Value of Metal Layer

An antenna part of a circuit pattern of a planar antenna was cut out into a sample of 1 mm in width and 8 mm in length, and then the surface resistance value of a metal layer was measured in accordance with JIS K 7194: 1994. Loresta GP (Type MCP-T600, TFP probe: Model MCP-TFP) manufactured by DIA INSTRUMENTS CO., LTD. was used as a resistivity measurement instrument, and the evaluation was performed at a temperature of 25° C. and under a humidity of 50% RH. Further, the measurement was performed on 6 samples, and an arithmetic average value of 4 samples excluding the maximum value and the minimum value was considered to be the surface resistance value of the metal layer of the present invention.

Moreover, in the case where the protective layer existed in the antenna part, the protective layer was removed by using a paint remover ("Remover S-031" manufactured by Asahipen Corp.) at a temperature of 30° C., washed with water, cut into a piece of 1 mm in width and 8 mm in length as described above, and the surface resistance value was measured.

2. Surface Resistance Value of Conductive Layer

A sample of 1 mm in width and 8 mm in length was produced by cutting out only one piece of the connection terminal part of the circuit pattern of the planar antenna or by pressure-welding a plurality of the cut-out pieces overlapped in such a way that the end surfaces of the conductive layer were opposed to each other at a temperature of 150° C. and a pressure of 3 MPa. Then, the surface resistance value of the conductive layer of the sample was measured in accordance with JIS K 7194: 1994. Loresta GP (Type MCP-T600, TFP probe: Model MCP-TFP) manufactured by DIA INSTRUMENTS CO., LTD. was used as a resistivity measurement instrument, and the evaluation was performed at a temperature of 25° C. and under a humidity of 50% RH. Further, the measurement was performed on 6 samples, and an arithmetic average value of 4 samples excluding the maximum value and the minimum value was considered to be the surface resistance value of the conductive layer of the present invention.

3. Thickness of Metal Layer, Protective Layer, and Conductive Layer

The sample was cut in the thickness direction with a microtome, its section was observed using a SEM of 10000 times magnification, and the thickness of the metal layer was measured. The measurement was performed on one sample on each item, one field and five points measurement was performed per one sample, and its average value was considered to be the thickness of the metal layer, the protective layer, and the conductive layer of the present invention.

4. Breaking Bend Durability

After adhering a copper foil having a thickness of 10 μm to the connection terminal part by heating it at 150° C. and 2 MPa for 3 minutes, the electric resistance value between the connection terminals was measured with an electric resistance meter that is capable of measuring up to 10 mΩ, and this was considered to be the initial electric resistance value (Ω). Then, the electric resistance value between the connection terminals was measured in the same manner by repeatedly bending the sample including two connection terminal parts that was cut into a piece of 10 mm in width and 100 mm in length 2000 times at a breaking bend angle of 90° and a perspective speed of 100 ppm with a loss flexing tester (manufactured by TESTER SANGYO CO., LTD.) in accordance with ASTM-D-1052. This was considered to be the electric resistance value (Ω) after the bending process. Then, the increase ratio (%) of the electric resistance value was calculated by the following formula.

Increase ratio of electric resistivity (%)=(electric resistance value after bending process (Ω)–initial electric resistance value (Ω))/initial electric resistance value (Ω)×100

Here, the measurement was performed on 10 samples, the breaking bend durability of the connection terminal part was considered to be good (A) if there were 8 samples or more with which the increase ratio of the electric resistance value was within 30%, and it was considered to be insufficient (B) if there were 7 samples or fewer.

5. Durability of Hot & High Humidity Environment

After adhering a copper foil having a thickness of 10 μm to the connection terminal part by heating it at 150° C. and 2 MPa for 3 minutes, the electric resistance value between the connection terminals was measured with an electric resistance meter that is capable of measuring up to 10 mΩ, and this was considered to be the initial electric resistance value (Ω). Next, a hot & high humidity process was performed on the sample (same as above) under the conditions of 80° C. and 90% RH for 500 hours, and then the electric resistance value between the connection terminals was measured in the same manner. This was considered to be the electric resistance value (Ω) after the hot & high humidity process. Then, the increase ratio (%) of the electric resistance value was calculated by the following formula.

Increase ratio of electric resistivity (%)=(electric resistance value after hot & high humidity process (Ω)–initial electric resistance value (Ω))/initial electric resistance value (Ω)×100

Here, the measurement was performed on 10 samples, the durability of the hot & high humidity environment of the connection terminal part was considered to be good (A) if there were 8 samples or more with which the increase ratio of the electric resistance value was within 30%, and it was considered to be insufficient (B) if there were 7 samples or fewer.

Example 1

Using a 75 μm thick biaxially oriented polyethylene terephthalate film (Lumirror S56 manufactured by Toray Industries, Inc.) as a plastic film, a 3 μm thick metal layer containing 99.99% aluminum was formed on one side of the biaxially oriented film with an induction heating type vacuum deposition device. At this time, the vacuum deposition was performed under a vacuum of 1 to $5 \times 10^{-6}$ Torr by controlling the voltage and current of an induction heating furnace, setting a traveling speed of the film in vacuum deposition to 1 m/min so that the thickness of the aluminum vacuum deposition layer becomes 3 μm.

In order to form a protective layer on the aluminum metal layer obtained in this way, a circuit pattern was screen-printed with a printing plate T-250 mesh using a printing ink (TETRON 990 Black manufactured by Jujo Chemical Co., Ltd.), and then heated and dried at 90° C. for 1 minute. Next, in order to form a heat-sealable conductive layer, a connection terminal part was printed three times by screen-printing with a printing plate T-250 mesh using the following resin composition A, and heated and dried at 100° C. for 30 minutes. The thickness of the protective layer obtained in this way was 2 μm, and the thickness of the conductive layer was 10 μm.

Next, the planar antenna shown in FIGS. 1 and 2 was obtained by treating the plastic film in which the circuit pattern was printed as described above with a 2% by weight sodium hydroxide solution at 40° C. for 5 minutes and dissolving and removing a part of the aluminum vacuum deposition layer in which the circuit pattern was not printed.

[Resin Composition A Used for Conductive Layer in which Conductive Particles are Dispersed]

NBR (PNR-1H manufactured by JSR Corporation): 100 parts by weight
Epoxy resin (Epicoat 834 manufactured by Yuka Shell Co., Ltd.) 100 parts by weight
3,3'-diaminodiphenylsulfone: 10 parts
Silver flakes (Silcoat AgC-239 manufactured by Fukuda Metal Foil & Powder Co., Ltd.): 700 parts by weight
Toluene: 455 parts by weight
Methylisobutylketone: 455 parts by weight The resin composition A in which conductive particles are dispersed was produced by placing the above-described raw materials in a ball mill of 2000 cm$^3$ (20 balls in 15 mmφ made of zirconia ceramic were input) and treating for 20 hours.

The surface resistance value of the metal layer, the surface resistance value of the conductive layer, the breaking bend durability, and the durability of the hot & high humidity environment of the obtained planar antenna are shown in Table 1. Both the breaking bend durability and the durability of the hot & high humidity environment were good. Further, a 50 μm thick PET film (Toray Industries, Inc. "Lumirror (registered trademark)" S10) coated with a commercially available hot melt adhesive was pasted to the above-described planar antenna at a temperature of 100° C., and then the antenna was bended repeated by a method used in the above-described breaking bend durability. However, there was no peeling of the PET film pasted to the antenna part, and the appearance was good.

Further, an IC tag was produced by compressing an electrode part of a strap (interposer) loaded with a UHF band 64 bit IC manufactured by Alien Inc. opposing to the connection terminal part of the planar antenna at a pressure of 8 kg/mm$^2$ and a temperature of 100° C. instead of the electrode (copper foil) adhered in the evaluation of the breaking bend durability. Bending was repeated on the obtained IC tag with the method performed in the above-described breaking bend durability evaluation, and there was no peeling of the strap and the connection terminal part. Further, the communication characteristics were confirmed by oppositely arranging the planar antenna to an antenna of a reader/writer manufactured by Alien Inc. (Model ALR-9780, EPC class1 (915 MHz), version SW Rev. 03,01,00) with an interval of 3 mm therebetween, and the communication characteristics were good.

Example 2

The planar antenna was produced with the same method as Example 1 except that only the protective layer at the surface layer of antenna part of the planar antenna produced in Example 1 was removed with a paint remover in the above-described evaluation method 1. The surface resistance value of the metallic vacuum deposition layer, the surface resistance value of the conductive layer, the breaking bend durability, and the durability of the hot & high humidity environment of the obtained planar antenna are shown in Table 1. Both the breaking bend durability and the durability of the hot & high humidity environment were good.

Further, similarly to Example 1, a PET film (Toray Industries, Inc. "Lumirror (registered trademark)" S10) was pasted at a temperature of 100° C., and then bending was repeated with a method used in the above-described breaking bend durability. The PET film pasted to the antenna part had been peeled a little although it was at a level not causing a practical problem.

Furthermore, similarly to Example 1, an IC tag was produced by compressing a strap (interposer) oppositely to the metal face of the connection terminal part at a pressure of 8 kg/mm² and a temperature of 100° C. The obtained IC tag was bended repeatedly similarly to Example 1. However, there was no peeling of the strap and the connection terminal part. Further, the communication characteristics were confirmed similarly to Example 1, and the communication characteristics were good.

Comparative Example 1

A planar antenna was produced by exposing the metal layer by removing the conductive layer at the surface of the connection terminal part of the planar antenna produced in Example 1 with a compound containing a polishing agent, loading an anisotropic conductive film (AC-2056 manufactured by Hitachi Chemical Co., Ltd.) on it, and compressing at a temperature of 150° C. and a pressure of 0.1 Mpa for 30 seconds. The surface resistance value of the metal layer, the breaking bend durability, and the durability of the hot & high humidity environment of the obtained planar antenna are shown in Table 1. The breaking bend durability and the durability of the hot & high humidity environment were seriously deteriorated.

Further, similarly to Example 1, a PET film (Toray Industries, Inc. "Lumirror (registered trademark)" S10) was pasted at a temperature of 100° C., and the antenna was bended repeatedly with a method used in the above-described breaking bend durability. There was no peeling of the PET film pasted to the antenna part, and the appearance was good.

Furthermore, similarly to Example 1, an IC tag was produced by compressing a strap (interposer) oppositely to the metal face of the connection terminal part at a pressure of 8 kg/mm² and a temperature of 100° C. The IC tag was bended repeatedly similarly to Example 1. However, there was no peeling of the strap and the connection terminal part. However, as the result of confirming the communication characteristics similarly to Example 1, the communication characteristics were seriously deteriorated compared with Example 1.

Comparative Example 2

A planar antenna was produced by exposing the metal layer by removing the conductive layer at the surface layer of the connection terminal part of the planar antenna produced in Example 1 with a compound containing a polishing agent, applying an anisotropic conductive paste (TAP0402E manufactured by KYOCERA Chemical Corporation) on it, and heat-treating at 160° C. for 15 minutes. Because the circuit pattern of the obtained planar antenna was deformed and largely waved especially at the connection terminal part, an IC chip could not be loaded. Further, the surface resistance value of the metal layer, the breaking bend durability, and the durability of the hot & high humidity environment are shown in Table 1. The breaking bend durability and the durability of the hot & high humidity environment were seriously deteriorated.

Further, similarly to Example 1, a PET film (Toray Industries, Inc. "Lumirror (registered trademark)" S10) was pasted at a temperature of 100° C., and the antenna was bended repeatedly with a method used in the above-described breaking bend durability. There was no peeling of the PET film pasted to the antenna part, and the appearance was good.

Furthermore, similarly to Example 1, an IC tag was produced by compressing a strap (interposer) oppositely to the metal face of the connection terminal part at a pressure of 8 kg/mm² and a temperature of 100° C. The IC tag was bended repeatedly similarly to Example 1. However, there was no peeling of the strap and the connection terminal part. However, as the result of confirming the communication characteristics similarly to Example 1, the communication was seriously deteriorated compared with Example 1.

Comparative Example 3

A planar antenna consisting of a circuit pattern of the metal layer only in which the conductive layer and the protective layer were removed was produced by removing the conductive layer and the protective layer from the planar antenna produced in Example 1 using a paint remover ("Remover S-031" manufactured by Asahipen Corp.) at a temperature of 30° C., washing with water, and drying.

The surface resistance value of the metal layer, the breaking bend durability, and the durability of the hot & high humidity environment of the obtained planar antenna are shown in Table 1.

Further, similarly to Example 1, a PET film (Toray Industries, Inc. "Lumirror (registered trademark)" S10) was pasted at a temperature of 100° C., and the antenna was bended repeatedly with a method used in the above-described breaking bend durability. The PET film pasted to the antenna part was peeled a little.

Furthermore, similarly to Example 1, an IC tag was produced by compressing a strap (interposer) oppositely to the metal face of the connection terminal part at a pressure of 8 kg/mm² and a temperature of 100° C. The welding of the strap of the obtained IC tag at the connection terminal part was insufficient and the strap was easily peeled by bending the planar antenna at the strap part.

Comparative Example 4

A planar antenna and an IC tag were produced with the same method as Comparative Example 3 except that the welding temperature of the strap (interposer) was 180° C.

The surface resistance value of the metal layer, the breaking bend durability, and the durability of the hot & high humidity environment of the obtained planar antenna are shown in Table 1.

After a PET film (Toray Industries, Inc. "Lumirror (registered trademark)" S10) was pasted and the antenna was bended repeatedly, the PET film pasted to the antenna part was peeled a little.

Further, the welding of the strap at the connection terminal part of the obtained IC tag was insufficient and the strap was easily peeled by strongly bending the planar antenna of the strap part several times. Further, the circuit pattern of the obtained planar antenna was deformed, largely waved especially at the connection terminal part, and the appearance was remarkably deteriorated.

TABLE 1

| | Type of metal of layer | Thickness of metal layer (μm) | Thickness of protective layer (μm) | Thickness of Heat-sealable conductive layer (μm) | Surface Resistance Value of Metal Layer (mΩ/□) | Surface Resistance Value of Heat-sealable conductive layer (mΩ/□) | Breaking bend Durability | Durability of Hot & high humidity environment |
|---|---|---|---|---|---|---|---|---|
| Example 1 | ALUMINUM | 3 | 2 | 10 | 22 | 25 | A | A |
| Example 2 | ALUMINUM | 3 | 0 | 10 | 22 | 25 | A | A |
| Comparative Example 1 | ALUMINUM | 3 | 2 | 0 | 22 | Impossible to be measured | B | B |
| Comparative Example 2 | ALUMINUM | 3 | 2 | 0 | 22 | Impossible to be measured | B | B |
| Comparative Example 3 | ALUMINUM | 3 | 0 | 0 | 22 | Impossible to be measured | Impossible to be measured | Impossible to be measured |
| Comparative Example 4 | ALUMINUM | 3 | 0 | 0 | 22 | Impossible to be measured | Impossible to be measured | Impossible to be measured |

INDUSTRIAL APPLICABILITY

When the planar antenna of the present invention and the manufacturing method thereof are used, an IC tag and a non-contact IC card that are flexible and in which a decrease of the communication characteristics is extremely small even when they are repeatedly bent can be provided at a low price. Further, productivity of the IC tag and the non-contact IC card can also be improved because the electrical connection with the electronic component such as an IC chip becomes easy.

BRIEF DESCRIPTION OF THE DRAWINGS

FIG. 1 is a schematic plane view of the planar antenna of the present invention.

FIG. 2 is a schematic view of the section referred to with arrows I-I of the planar antenna shown in FIG. 1.

DESCRIPTION OF THE REFERENCE NUMERALS

1 PLASTIC FILM
2 METAL LAYER
3 PROTECTIVE LAYER (ANTENNA PART)
4 HEAT-SEALABLE CONDUCTIVE LAYER (CONNECTION TERMINAL PART)
5 CIRCUIT PATTERN

The invention claimed is:

1. A planar antenna having a circuit pattern comprising an antenna part and a connection terminal part on a plastic film, wherein the circuit pattern has a metal layer and a heat-sealable conductive layer provided directly on a surface layer of a connection terminal part of the metal layer, wherein the conductive layer is a resin layer containing a conductive particle or a conductive fiber.

2. The planar antenna as in claim 1 having a protective layer of the antenna part on a surface layer of an antenna part of the metal layer.

3. The planar antenna as in claim 1, wherein the surface resistance value of the metal layer is 0.5 to 200 mΩ/□.

4. The planar antenna as in claim 1, wherein the metal layer is substantially composed of aluminum.

5. The planar antenna as in claim 1, wherein the metal layer is a metallic vacuum deposition layer.

6. The planar antenna as in claim 1, wherein the resin layer is comprised of an epoxy resin, a curing agent of the epoxy resin, and a rubber.

7. The planar antenna as in claim 6, wherein the rubber is a rubber having an unsaturated carbon bond in the main chain.

8. The planar antenna as in claim 1, wherein the thickness of the conductive layer is 1 to 50 μm.

9. A manufacturing method of a planar antenna including a step A of providing a metal layer constituting a circuit pattern comprising an antenna part and a connection terminal part on a plastic film,
a step B of providing a protective layer of antenna part on a part constituting an antenna part of the metal layer,
a step C of providing a heat-sealable conductive layer directly on a part constituting a connection terminal part of the metal layer, and
a step D of removing a part that does not constitute a circuit pattern of the metal layer with etching after the step B and the step C.

10. The manufacturing method of a planar antenna as in claim 9, wherein a metal layer with a thickness of 0.2 to 50 μm is provided in the step A.

11. The manufacturing method of a planar antenna as in claim 9, wherein a circuit pattern is formed by using a film provided with a metal layer on a plastic film with vacuum deposition in the step A.

12. The manufacturing method of a planar antenna as in claim 9, wherein a metal layer substantially comprised of aluminum is provided in the step A.

13. The manufacturing method of a planar antenna as in claim 12, wherein an alkaline resistant protective layer is provided in the step B, an alkaline resistant conductive layer is provided in the step C, and etching is performed using an alkaline liquid in the step D.

* * * * *